(12) United States Patent  
Takemura et al.

(10) Patent No.: US 8,947,272 B2
(45) Date of Patent: *Feb. 3, 2015

(54) DECODING ENCODED DATA

(71) Applicant: International Business Machines Corporation, Armonk, NY (US)

(72) Inventors: Kiyoshi Takemura, Yamato (JP); Nobuyoshi Tanaka, Machida (JP); Makoto Ogawa, Yamato (JP); Tadayuki Okada, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 89 days.

This patent is subject to a terminal disclaimer.

(21) Appl. No.: 13/669,612

(22) Filed: Nov. 6, 2012

(65) Prior Publication Data

US 2013/0063287 A1 Mar. 14, 2013

Related U.S. Application Data

(63) Continuation of application No. 13/313,772, filed on Dec. 7, 2011, now Pat. No. 8,542,137.

(30) Foreign Application Priority Data

Dec. 7, 2010 (JP) ................................. 2010-272970

(51) Int. Cl.
*H03M 7/40* (2006.01)
*H03M 7/46* (2006.01)
(Continued)

(52) U.S. Cl.
CPC .............. *H03M 7/4031* (2013.01); *H03M 7/46* (2013.01); *G06T 9/005* (2013.01); *H03M 7/30* (2013.01); *H03M 7/40* (2013.01)
USPC .............................................. 341/65; 341/67

(58) Field of Classification Search
CPC ........... H03M 7/40; H03M 7/30; H03M 7/46; G06T 9/005
USPC ....................... 341/65, 55, 63, 67, 79, 51, 106
See application file for complete search history.

(56) References Cited

U.S. PATENT DOCUMENTS 8,542,137 B2 * 9/2013 Takemura et al. ............... 341/65

FOREIGN PATENT DOCUMENTS

JP 02-050667 B 4/1986
JP 07170197 7/1995

(Continued)

OTHER PUBLICATIONS

U.S. Appl. No. 13/313,772 entitled "Decoding Encoded Data"; Non-final office action dated Mar. 6, 2013. 7 pg.

(Continued)

*Primary Examiner* — Joseph Lauture
(74) *Attorney, Agent, or Firm* — Russell Ng PLLC; Steven Bennett

(57) ABSTRACT

A method for decoding encoded data includes receiving data encoded by replacing each of a plurality of characters with bit strings. The method also includes recording, on the basis of definition information, at least one of the characters as corresponding to each of the bit lengths, and generating decode information based on the number of characters, wherein the decode information includes bit string information for sorting the bit strings in a bit length order that is a predetermined order associated with bit lengths. The method also includes, in response to receiving a particular bit length, generating character information in which the characters are sorted in the bit length order by inserting a character corresponding to the particular bit length into a position corresponding to the particular bit length in an array in which at least one of the bit lengths.

4 Claims, 15 Drawing Sheets

(51) Int. Cl.
  *G06T 9/00* (2006.01)
  *H03M 7/30* (2006.01)

(56) References Cited

FOREIGN PATENT DOCUMENTS

| JP | 08167855 | 6/1996 |
| JP | 2001044849 A | 2/2001 |
| JP | 2001084707 A | 3/2001 |
| JP | 2010258532 A | 11/2010 |

OTHER PUBLICATIONS

U.S. Appl. No. 13/313,772 entitled "Decoding Encoded Data"; Notice of Allowance dated May 17, 2013. (13 pg).

* cited by examiner

| Character | Code |
|---|---|
| A | 010 |
| B | 011 |
| C | 11100 |
| D | 100 |
| E | 00 |
| F | 1100 |
| G | 11101 |
| H | 1101 |
| I | 101 |
| J | 11110 |
| K | 11111 |

| Character | Bit Length |
|---|---|
| A | 3 |
| B | 3 |
| C | 5 |
| D | 3 |
| E | 2 |
| F | 4 |
| G | 5 |
| H | 4 |
| I | 3 |
| J | 5 |
| K | 5 |

| Character | Bit Length |
|---|---|
| A | 3 |
| B | 3 |
| C | 5 |
| D | 3 |
| E | 2 |
| F | 4 |
| G | 5 |
| H | 4 |
| I | 3 |
| J | 5 |
| K | 5 |

Fig. 4

```
code = 0;
b1_count[0] = 0;
for (bits = 1; bits <= MAX_BITS; bits++) {
        code = (code + b1_coun[bits-1]) <<1;
        code_min[bits] = code;
}
```

| M | code_min[M] | code_max[M] |
|---|---|---|
| 1 | | |
| 2 | 0 | 0 |
| 3 | 010 | 101 |
| 4 | 1100 | 1101 |
| 5 | 11100 | 11111 |

| M | code_min[M] | code_max[M] | Pointer |
|---|---|---|---|
| 1 | | | 0 |
| 2 | 00 | 00 | 0 |
| 3 | 010 | 101 | 1 |
| 4 | 1100 | 1101 | 5 |
| 5 | 11100 | 11111 | 7 |

Fig. 7

DECODING ENCODED DATA

This application is a continuation of U.S. patent application Ser. No. 13/313,772 entitled "DECODING ENCODED DATA," by Kiyoshi Takemura et al., filed on Dec. 7, 2011, which claims priority to Japanese Patent Application No. 2010-272970, entitled "Method and Apparatus for Decoding Encoded Data," filed on Dec. 7, 2010, the disclosure of which is hereby incorporated by reference in its entirety.

BACKGROUND

1. Technical Field

The present invention generally relates to decoding encoded data, and in particular to decoding encoded data that is encoded by replacing each of multiple symbols with a bit string.

2. Description of the Related Art

Deflate compression (RFC1951) is a compression method used as a basis for ZLIB (RFC1950) and GZIP (RFC1952), which are data compression formats currently widely used in computers. In this method, data is compressed by using a coding technique called Huffman coding. In Huffman coding, each single-byte character repeatedly appearing in data is assigned a variable-length code in accordance with the frequency of appearance. The coding can be performed more efficiently if a frequently appearing character is assigned a code having a short bit length while a less-frequently appearing character is assigned a code having a long bit length.

For efficient Huffman coding, a Huffman table, which stores a code assigned to each character, is created and added to compressed data. Then, the compressed data is decoded by reference to the Huffman table.

However, adding a large-size Huffman table to the compressed data lowers the compression rate. To improve this compression rate, the Huffman table itself is also compressed in deflate compression (RFC1951).

Specifically, in deflate compression, a Huffman table stores the length of a code (bit length) assigned to each character, instead of storing a code assigned to each character. It is defined, in deflate compression, that codes in a group having the same bit length are assigned respectively to characters in the ASCII code order (in the alphabetical order if target characters are alphabets). In this way, a code for each character can be uniquely determined based on the bit length.

Conventionally, some techniques have been proposed as techniques for decoding encoded data by using a Huffman table (see Japanese Patent Application Publication No. Hei 7-170197 and Japanese Patent Application Publication No. Hei 8-167855, for example).

In Japanese Patent Application Publication No. Hei 7-170197, the number of code bits to be fetched first for decoding is written to a decode table. Then, with the "root" of a code tree set as a target node, it is judged whether a "child" of the target node is a "leaf (terminal node)" or an intermediate node. If the child is a "leaf," a decode termination instruction for returning an event value corresponding to the leaf is written to the decode table. If the child is an intermediate node, on the other hand, a decode continuation instruction for returning an address to be accessed next and the number of code bits to be extracted next for the decoding is written to the decode table. Thereafter the above operations are repeated recursively by setting the "child" as a new target node.

In Japanese Patent Application Publication No. Hei 8-167855, in a Huffman decoding circuit, an encoded-data fetching unit fetches a code bit string supplied externally and then creates encoded data having a certain bit length, and a Huffman-decoding look-up table outputs, upon receipt of the encoded data created by the encoded-data fetching unit, decoded data corresponding to a code of high-order bits of the encoded data and the bit length of the code. The encoded-data fetching unit discards high-order data of an amount corresponding to the bits of the bit length outputted by the Huffman-decoding look-up table, fetches new data supplied externally in return, and thereby creates encoded data having the certain bit length.

To decode compressed data by using a compressed Huffman table in any of the above-described methods, the following steps need to be taken: (1) extracting a bit length; and (2) decoding a code based on the extracted bit length. In this process, to perform the step (2) at a high speed, the Huffman table needs to be subjected to bitwise sorting in advance.

However, the sorting processing is required to be performed repeatedly the same number of times as the number of the codes. For this reason, if the number of the codes is large, a long time is required for the processing.

BRIEF SUMMARY

Disclosed are a method, a system and a computer program product for encoded data. The method includes receiving encoded data that is encoded by replacing each of a plurality of characters with one of a plurality of bit strings corresponding to the character. The method also includes recording, on the basis of definition information defining a plurality of bit lengths of the bit strings each corresponding to one of the plurality of characters, at least one of the plurality of characters as corresponding to each of the plurality of bit lengths. The method also includes generating decode information based on the number of characters recorded by the recording unit, wherein the decode information comprises bit string information for sorting the plurality of bit strings in a bit length order that is a predetermined order associated with bit lengths. The method also includes, in response to receiving a particular bit length among the plurality of bit lengths, generating character information in which the plurality of characters are sorted in the bit length order by inserting a character corresponding to the particular bit length into a position corresponding to the particular bit length in an array in which at least one of the plurality of bit lengths, wherein the particular bit length and a previously received bit length are sorted in the bit length order.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein:

FIG. 4 is a diagram showing an example of a compressed Huffman table created by the general frequency-of-use calculation circuit of the Huffman table decoding circuit.

FIG. 7 is a view showing an example of a decode code table created by the general decode data calculation circuit of the Huffman table decoding circuit

DETAILED DESCRIPTION

An embodiment of the present invention will be described below with reference to the accompanying drawings.

Figure 1:
FIG. 1 is a diagram depicting compression of a Huffman table.

FIG. 1 is a view showing a method of compressing a concrete example of a Huffman table used in the embodiment.

In FIG. 1, the table on the left side of the bold arrow is a non-compressed Huffman table, while the table on the right side of the bold arrow is a compressed Huffman table. Specifically, a code is assigned to each character in the non-compressed Huffman table, while the bit length of a code, instead of the code, is assigned to each character in the compressed Huffman table. To be precise, "2," instead of "00," is assigned to E; "3," instead of "010," "011," "100" and "101," is assigned to A, B, D and I; "4," instead of "1100" and "1101," is assigned to F and H; and "5," instead of "11100," "11101," "11110" and "11111," is assigned to C, G, J and K. It should be noted that, although a code or bit length may be assigned to a character string in general, description will be given of a case of assigning a code or a bit length to a character in the embodiment.

Figure 2:
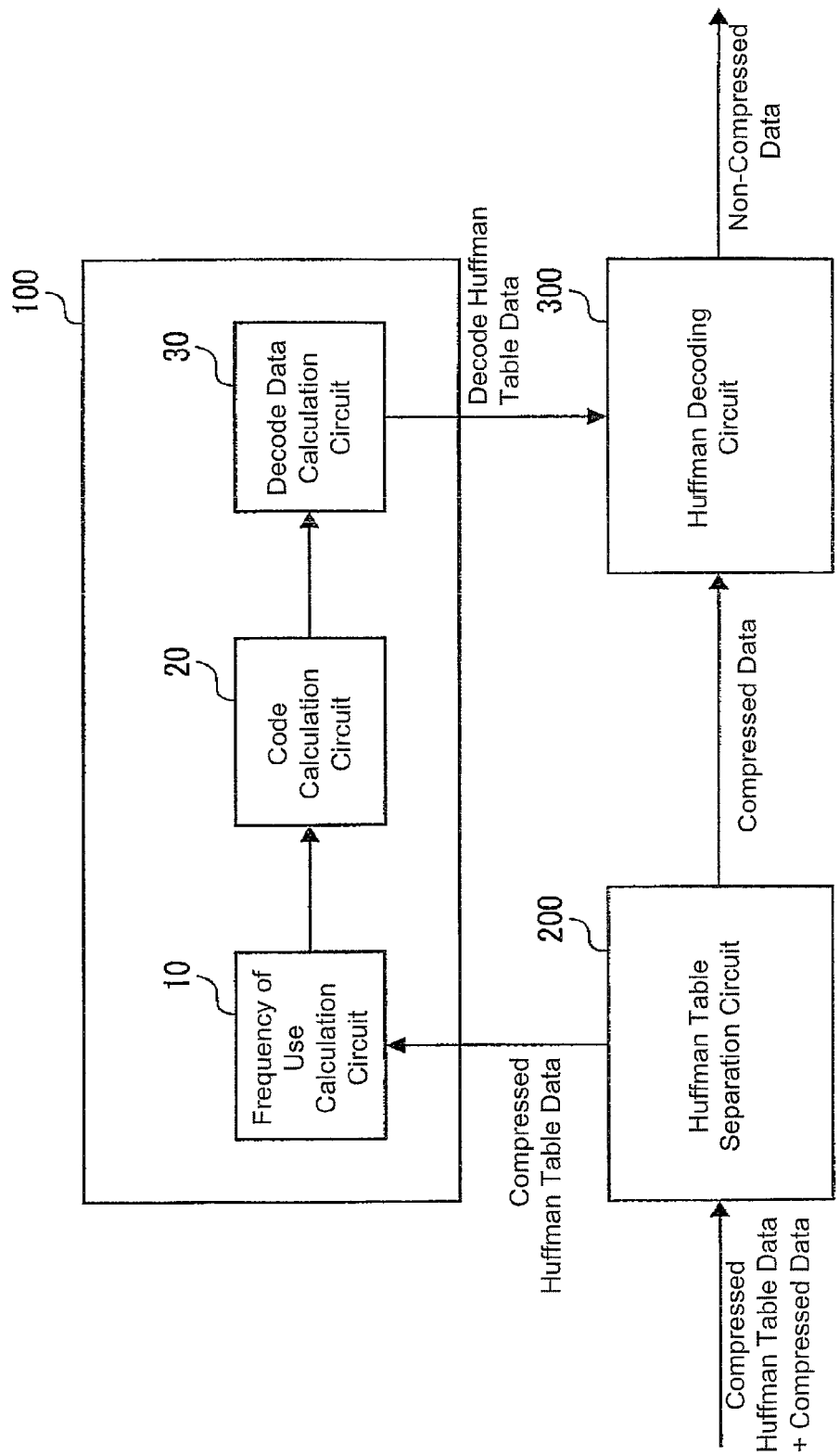
FIG. 2 is a diagram depicting a configuration example of a Huffman decoding apparatus to which one or more embodiments is applied.

FIG. 2 is a diagram showing a configuration example of a Huffman decoding apparatus of the embodiment.

An example of the Huffman decoding apparatus is a communication apparatus, such as a router, that is required to quickly perform processing for uncompressing compressed data to perform a virus check or the like on the data and then compressing the data again. Alternatively, the Huffman decoding apparatus may be a general computer such as a PC (personal computer).

As shown in FIG. 2, the Huffman decoding apparatus includes a Huffman table decoding circuit 100, a Huffman table separation circuit 200 and a Huffman decoding circuit 300.

The Huffman table decoding circuit 100 creates, upon receipt of data on the compressed Huffman table (referred to as "compressed Huffman table data" below) from the Huffman table separation circuit 200, Huffman table data to be used for decoding (referred to as "decode Huffman table data" below) and the like on the basis of the compressed Huffman table data, and then outputs the created decode Huffman table data and the like to the Huffman decoding circuit 300. Here, the compressed Huffman table data is data including an array of only the bit lengths included in the compressed Huffman table shown in FIG. 1. It is assumed here that the bit lengths are sorted in an order of the case in which the characters are sorted in the ASCII code order in the Huffman table. Meanwhile, the decode Huffman table data is data on a table obtained by converting, for the use for decoding, the compressed Huffman table shown in FIG. 1.

Although the present embodiments are applied to "characters," characters are merely used as an example of symbols, and the present embodiments are also applicable to numbers and symbols other than characters and numbers (symbols in the narrow sense). However, for simplification, description will be given below by using characters, especially alphabets, as an example.

As shown in FIG. 2, the Huffman table decoding circuit 100 of the embodiment includes a frequency-of-use calculation circuit 10, a code calculation circuit 20 and a decode data calculation circuit 30.

Upon receipt of an input of the compressed Huffman table data, the frequency-of-use calculation circuit 10 calculates the frequency of use of each bit length (the number of characters to which each bit length is assigned), and creates a compressed Huffman table storing the bit length of each character.

The code calculation circuit 20 creates a code table storing a minimum code and a maximum code used for each bit length, on the basis of the frequency of use of the bit length calculated by the frequency-of-use calculation circuit 10.

The decode data calculation circuit 30 calculates decode Huffman table data on the basis of the compressed Huffman table data, and calculates code table data to be used for decoding (referred to as "decode code table data" below), on the basis of the code table created by the code calculation circuit 20.

Upon receipt of combined data including, in a combined manner, the compressed Huffman table data and compressed data obtained by replacing each character included in the data with the code assigned to the character, the Huffman table separation circuit 200 separates the combined data into the compressed Huffman table data and the compressed data, and then outputs the former to the Huffman table decoding circuit 100 and the latter to the Huffman decoding circuit 300. In the embodiment, the compressed Huffman table data is used as an example of definition information defining multiple bit lengths, and the compressed data is used as an example of encoded data obtained by replacing each symbol with a bit string. Moreover, the Huffman table separation circuit 200 is provided as an example of an extraction unit for extracting definition information.

Furthermore, the Huffman decoding circuit 300 uncompresses the compressed data to obtain the non-compressed data, by replacing each code included in the compressed data inputted by the Huffman table separation circuit 200 with a character determined on the basis of the decode Huffman table data and the decode code table data inputted by the Huffman table decoding circuit 100. The Huffman decoding circuit 300 then outputs the non-compressed data thus obtained. In the embodiment, the Huffman decoding circuit 300 is provided as an example of a conversion unit for converting each bit string into a symbol.

Detailed operations of the three circuits included in the Huffman table decoding circuit 100 will be described below. First, general operations of the three circuits will be described as a "General Huffman Table Decoding Method," and then operations of the three circuits in the embodiment are described as a "Decoding Method Using Huffman Table of Embodiment." In the following description, it is assumed that the compressed Huffman table data "3, 3, 5, 3, 2, 4, 5, 4, 3, 5, 5" is inputted to the Huffman table decoding circuit 100 as in the example in FIG. 1. In addition, although a maximum of 286 characters are defined and a maximum of 15 bit lengths are defined in RFC1951, only 11 characters are shown as characters and bit lengths each having a maximum of 5 bits are shown.

Figure 3:
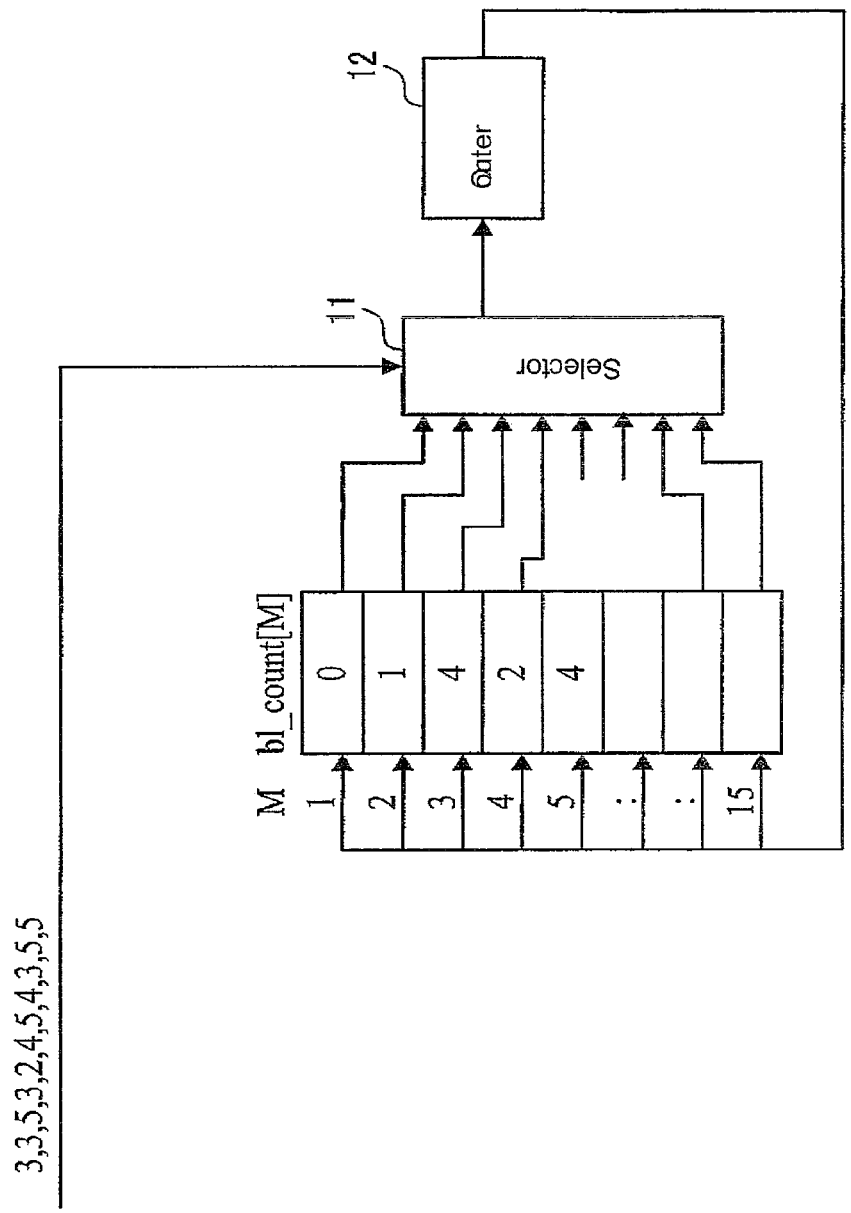
FIG. 3 is a diagram showing a configuration example of a general frequency-of-use calculation circuit of a Huffman table decoding circuit.

FIG. 3 is a diagram showing a general frequency-of-use calculation circuit 10.

FIG. 3 shows that compressed Huffman table data "3, 3, 5, 3, 2, 4, 5, 4, 3, 5, 5" is inputted to the frequency-of-use calculation circuit 10. In this case, it is assumed that one bit length included in the compressed Huffman table data is inputted in one clock cycle. Then, every time a bit length is inputted, a selector 11 fetches a number stored at this point in b1_count[M] corresponding to the bit length. Thereafter, a counter 12 stores, in the same b1_count[M], a number obtained by adding "1" to the fetched number.

In this example embodiment, the frequency of use of each inputted bit length is stored in b1_count[M]. In the example in FIG. 3, "1," "4," "2" and "4" are stored respectively in b1_count[2], b1_count[3], b1_count[4] and b1_count[5] at the time when all the data pieces are inputted.

Here, the value stored in b1_count[M] is an example of the number of symbols having the same bit length. In addition, in the embodiment, the frequency-of-use calculation circuit 10 is provided as an example of a recording unit for recording the number of symbols.

Moreover, although not illustrated in FIG. 3, the general frequency-of-use calculation circuit 10 creates a compressed Huffman table in which the bit length of each character is recorded, while counting the number of characters having each bit length.

FIG. 4 is a view showing an example embodiment of the compressed Huffman table.

As shown in FIG. 4, the compressed Huffman table associates each character with a corresponding bit length, and is created by recording data pieces of inputted compressed Huffman table data in the inputted order. In the compressed Huffman table data, multiple bit lengths are sorted in the alphabetic order based on the characters to which the bit lengths are assigned. Accordingly, the bit lengths are sorted in the alphabetic order in the compressed Huffman table as well.

Figures 5A, 5B, 5C:
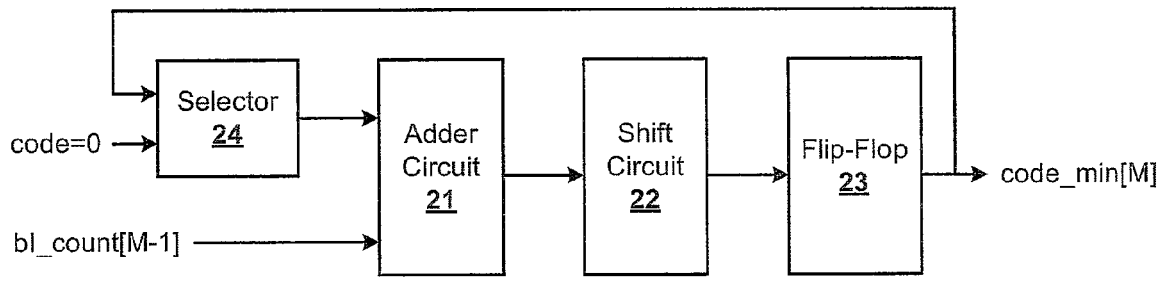
FIGS. 5A, 5B and 5C are views showing a configuration example of a general code calculation circuit of the Huffman table decoding circuit.

FIGS. 5A-5C depict embodiments of a general code calculation circuit 20.

As described above, b1_count[M] in FIG. 3 and the compressed Huffman table in FIG. 4 are created through the processing by the frequency-of-use calculation circuit 10.

Subsequently, the code calculation circuit 20 assigns a minimum code code_min of each bit length on the basis of b1_count[M]. The code calculation circuit 20 also determines a maximum code code_max of each bit length.

Specifically, code_min is determined in accordance with the formula shown in FIG. 5A. It should be noted that the formula is defined in RFC1951, and is optimized to be able to assign a code having the shortest code length on the basis of b1_count[M]. Although details are omitted here, one or more embodiments involve calculating "code=(code+b1_count[bits−1]<<1)."

A circuit for calculating code_min in accordance with the formula can be formed by combining an adder circuit 21, a shift circuit 22, a flip-flop 23 and a selector 24 as shown in FIG. 5B. When M=1, the selector 24 selects a code "0," the adder circuit 21 adds "0" and b1_count[0], the shift circuit 22 shifts the result by 1 bit to the left, the flip-flop 23 holds the result, and the result thus held is outputted as code_min[1]. Then, when M=2, the selector 24 selects the result held by the flip-flop 23, the adder circuit 21 adds the selected result and b1_count[1], the shift circuit 22 shifts the obtained result by 1 bit to the left, the flip-flop 23 holds the result, and the result thus held is outputted as code_min[2]. Thus, the circuit is configured to sequentially output code_min[M] in response to sequential inputs of b1_count[M−1].

Meanwhile, code_max[M] can be obtained in accordance with "code_min[M]+b1_count[M]−1."

In this way, the code calculation circuit 20 creates a code table associating the minimum code code_min and the maximum code code_max with each bit length.

In the example used in the embodiment, the minimum code code_min[M] and the maximum code code_max[M] of each bit length are as shown in the code table in FIG. 5C. In this case, if the maximum bit length is B, the processing time is O(B). Although B=5 (clocks) in this example, the maximum value is B=15 (clocks) since the maximum bit length is defined as "15" in RFC1951.

Here, each value stored in code_min[M], i.e. each minimum code, is an example of a reference bit string serving as a reference of bit strings having the corresponding bit length, or a minimum bit string having the bit length, and the code table is an example of bit string information or decode information. Moreover, in one or more embodiments, the code calculation circuit 20 is provided as an example of a first generation unit for generating bit string information.

The bit length of each code included in the compressed data inputted by the Huffman decoding circuit 300 can be obtained by reference to the result of the processing by the code calculation circuit 20. Accordingly, the code assigned to each character can be obtained from the compressed Huffman table in FIG. 4. However, since data pieces in the compressed Huffman table in FIG. 4 are not sorted by bit length, the table is not optimal for searching. Such being the case, the decode data calculation circuit 30 sorts the data pieces in the compressed Huffman table in FIG. 4 in a bit length order, and in an ASCII code order for the data having the same bit length.

Figure 6:
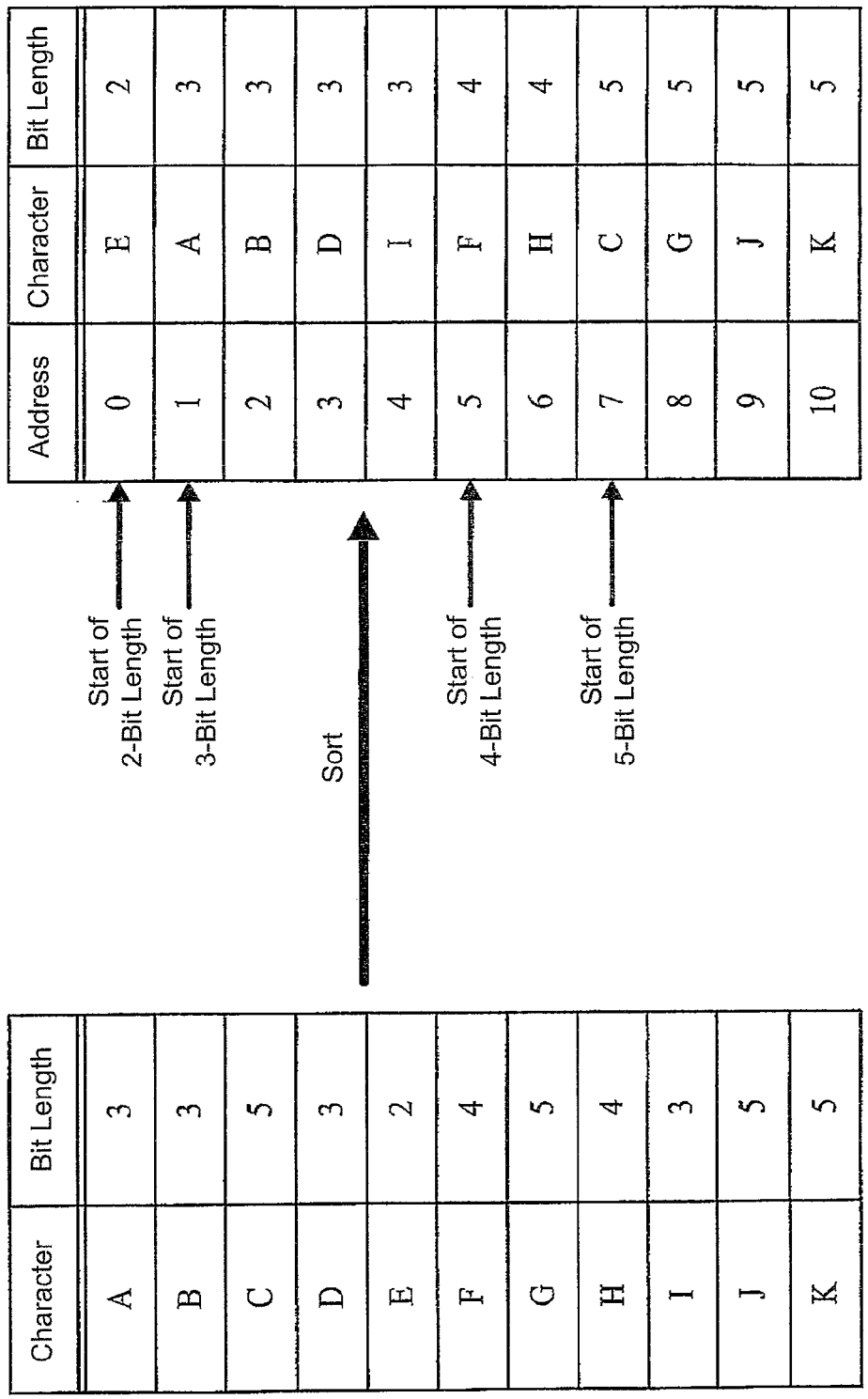
FIG. 6 is a diagram depicting sorting by a general decode data calculation circuit of the Huffman table decoding circuit.

FIG. 6 is a diagram depicting sorting, by a general decode data calculation circuit of the Huffman table decoding circuit.

In FIG. 6, the table on the left side of the bold arrow is the compressed Huffman table, and the table on the right side of the bold arrow is a sorted compressed Huffman table (decode Huffman table).

As shown in FIG. 6, the decode Huffman table, as the compressed Huffman table, associates each character with a corresponding bit length. However, in the decode Huffman table obtained by sorting the data pieces in the compressed Huffman table in the bit length order, the multiple characters are sorted in the bit length order.

In FIG. 6, the address in which information on each character is stored is also shown to indicate the start of each bit length.

Thus, searching is facilitated by the sorting for additionally creating the decode Huffman table including characters sorted in the bit length order. To be precise, a character of the character can easily be searched out by subtracting code_min from the corresponding code in the inputted compressed data.

Moreover, the decode data calculation circuit 30 adds, to the code table in FIG. 5C, a pointer for indicating the start of each bit length in the decode Huffman table on the right side in FIG. 6.

FIG. 7 is a view showing a code table to which pointers are thus added (referred to as a "decode code table" below).

To obtain the Huffman table through decoding based on the decode Huffman table on the right side in FIG. 6 and the decode code table in FIG. 7, for each bit length in the decode Huffman table, the codes from code_min to code_max included in the decode code table and corresponding to the bit length are sequentially assigned to the characters of the bit length.

In the general Huffman table decoding method, the sorting processing in FIG. 6 and the pointer adding processing in FIG. 7 are serial processing. For this reason, the processing by the decode data calculation circuit 30 requires the number of clocks corresponding to the number of the characters. In this example, at least 11 clocks are required even if various kinds of efforts are tried. Moreover, since 286 symbols are involved in total, at least 286 clocks are required to subject all the symbols to the processing. Thus, 286 is the maximum number of clocks.

In the following, the throughput of the general Huffman table decoding method is considered.

First, the frequency-of-use calculation circuit 10 completes the processing simply by handing over the data pieces in the Huffman table. However, after the passing of all the data pieces, the code calculation circuit 20 takes 15 clocks at maximum to complete the processing, and the decode data calculation circuit 30 takes 286 clocks at maximum to complete the processing. Consequently, the decoding for obtaining the Huffman table first completes after 301 clocks in total in this case.

If the pipeline processing for generating a decode Huffman table from a compressed Huffman table, decode compressed data by using the decode Huffman table, and generating a next decode Huffman table in parallel with the decoding of the compressed data is performed smoothly, uncompressing of the compressed data can also be performed smoothly. However, the pipeline processing cannot be performed smoothly if 301 clocks are required at maximum to obtain a decode Huffman table after all the data pieces are handed over. This means that the processing by the decode data calculation circuit 30 is a bottleneck in performing the pipeline processing.

The embodiment speeds up the processing by the decode data calculation circuit 30. A Huffman table of the decode data calculation circuit 30 is essential for performing Huffman decoding efficiently. For this reason, the Huffman table needs to be created as a table including data pieces that are sorted by bit length group in advance. The general decode data calculation circuit 30 creates the compressed Huffman table, including data pieces sorted in alphabetical order, on the left side in FIG. 6 first, and then performs sorting to thereby create the decode Huffman table on the right side in FIG. 6. However, such sorting processing requires 286 clocks at least.

By contrast, in one or more embodiments, a table including data pieces already sorted is created directly. For this purpose, a shift memory circuit (register) with an insertion function is used.

Figure 8:
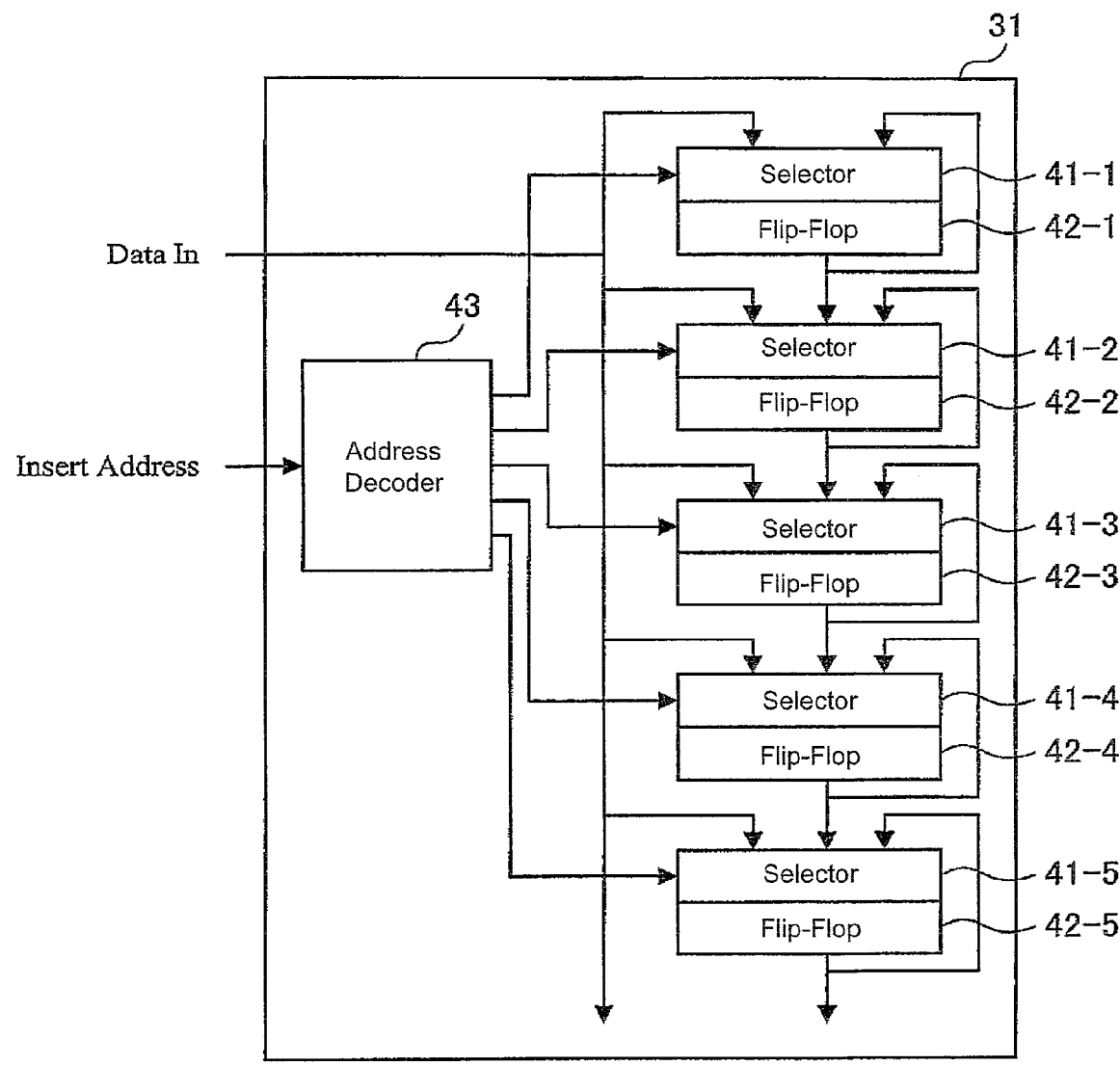
FIG. 8 is a diagram showing a shift memory circuit with an insertion function used by the decode data calculation circuit of the Huffman table decoding circuit according to one or more embodiments.

FIG. 8 is a diagram showing a shift memory circuit 31 with an insertion function.

The shift memory circuit 31 with an insertion function has a feature of being capable of not only reading and writing a data piece from and to any address as a usual memory but also shifting the data pieces in the addresses subsequent to the address to which the data piece is written. For example, if the shift memory circuit 31 with an insertion function is of 16 bytes, the shift memory circuit 31 with an insertion function can write a data piece to an address 10 and can at the same time shift and write data pieces stored in the address 10 to an address 14, to the address 11 to an address 15. Here, a data piece stored in the address 15 before the shifting is shifted out and deleted.

Specifically, a selector 41-N at an address N selects one of a character code inputted from Data In, a character code held by a flip-flop 42-(N-1) at an address (N-1), and a character code held by a flip-flop 42-N at the address N, and thereby causes the flip-flop 42-N at the address N to hold the selected character code. Here, it is an address decoder 43 that instructs the selector 41-N which character code to select. If an address inputted from Insert Address is an address K, the address decoder 43 outputs a signal to select the character code held by the flip-flop 42-N at the address N, to the selector 41-N (N=1, 2, . . . , K-1), a signal to select the character code inputted from Data In, to the selector 41-N (N=K), and a signal to select the character code held by the flip-flop 42-(N-1) at the address (N-1).

Figure 9:
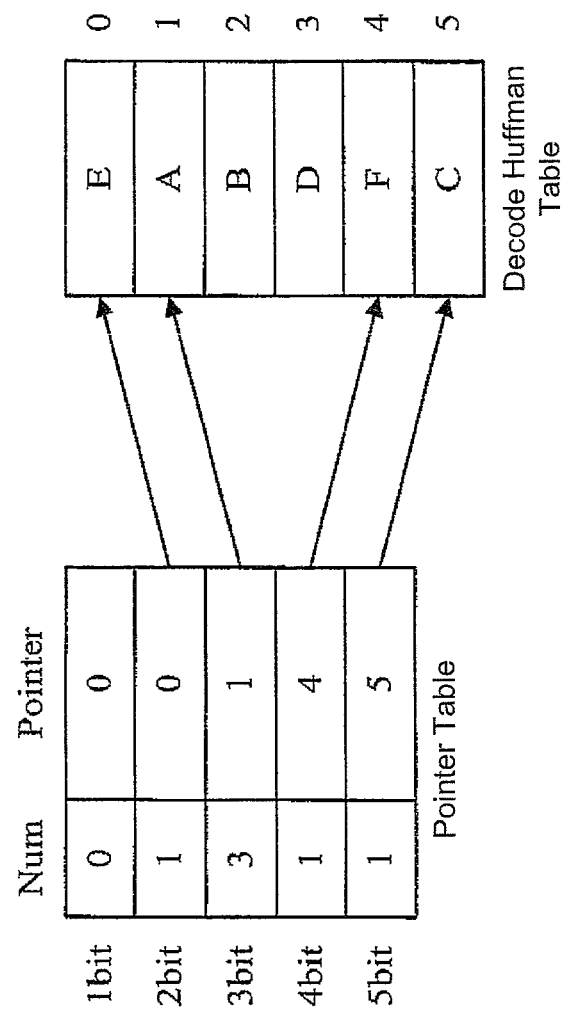
FIG. 9 is a view showing a pointer table and a decode Huffman table of the decode data calculation circuit in the Huffman table decoding circuit according to one or more embodiments.

FIG. 9 is a view showing a method of using the shift memory circuit 31 with an insertion function for the decode Huffman table.

As shown in FIG. 9, the shift memory circuit 31 with an insertion function is used for the sorted Huffman table (decode Huffman table) on the right side in FIG. 6. In addition to this, a pointer table is prepared which includes a Num section for storing the number of characters to which each bit length is assigned, and a Pointer section for storing the first one of the addresses storing the character codes having each bit length.

Here, description will be given by using data pieces "3, 3, 5, 3, 2, 4" corresponding respectively to characters A to F among the inputted compressed Huffman table data pieces "3, 3, 5, 3, 2, 4, 5, 4, 3, 5, 5."

The Num section stores, for each of the bit lengths "1," "2," "3," "4" and "5," the number of characters to which the bit length is assigned.

The Pointer section stores, respectively for the bit lengths "1," "2," "3," "4" and "5," storage addresses "0," "0," "1," "4" and "5" of the characters, to which the bit lengths are assigned, in the decode Huffman table.

FIGS. 10A-10F are views showing an example of the process. The process will also be described by taking, as an example, decoding in a case where "3, 3, 5, 3, 2, 4" are inputted respectively as bit lengths for A, B, C, D, E and F.

First, both tables are empty immediately after reset.

Figure 10A:
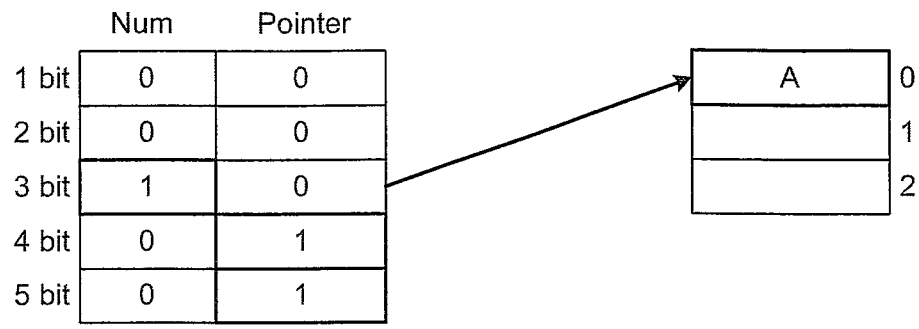
FIGS. 10A-10C are views showing an example of update of the pointer table and the decode Huffman table in the decode data calculation circuit of the Huffman table decoding circuit according to one or more embodiments.

Then, assume that "3" is inputted as a bit length of A. In response to the input, a character code of A is stored in an address 0 in a decode Huffman table as shown in FIG. 10A. At this time, in a pointer table, the value for a bit length of 3 in a Num section is incremented to "1," and the value for each of a bit length of 4 and a bit length of 5 in a Pointer section is incremented to "1."

Figure 10B:
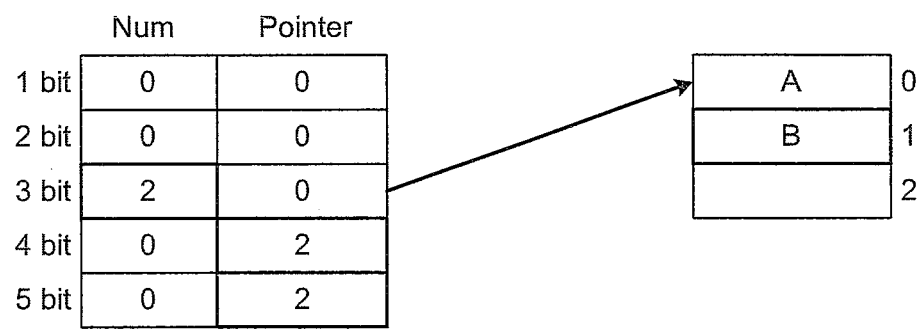

Then, assume that "3," as in the case of A, is inputted as a bit length of B. Here, the inputted bit length is the same as that of A. Accordingly, in response to the input, a character code of B is stored in an address subsequent to that in which the character code of A is stored in the decode Huffman table as shown in FIG. 10B. At this time, in the pointer table, the value for a bit length of 3 in the Num section is incremented to "2," and the value for each of a bit length of 4 and a bit length of 5 in the Pointer section is incremented to "2."

Figure 10C:
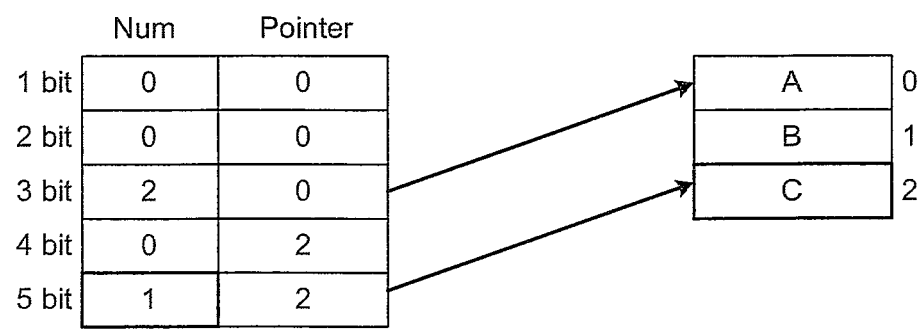

Then, assume that "5" is inputted as a bit length of C. Here, a bit length of 5 is longer than a bit length of 3. Accordingly, in response to the input, a character code of C is stored in an address subsequent to that in which the character code of a bit length of 3 is stored in the decode Huffman table, i.e. an address 2, as shown in FIG. 10C. At this time, in the pointer table, the value for a bit length of 5 in the Num section is incremented to "1," while the Pointer section is not updated since no bit length longer than a bit length of 5 would be involved.

Figure 10D:
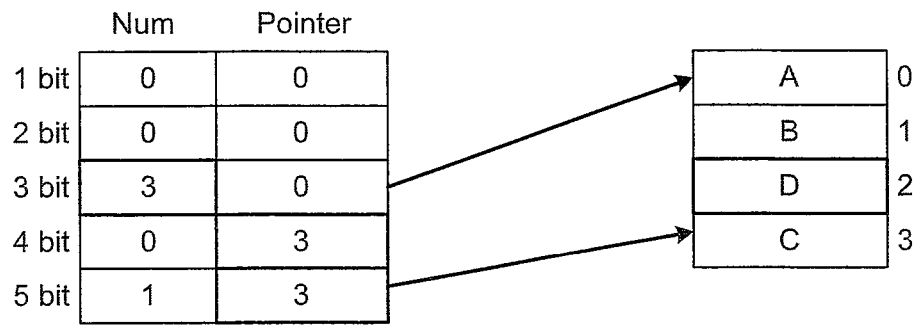
FIGS. 10D-10F are views showing the example of update of the pointer table and the decode Huffman table in the decode data calculation circuit of the Huffman table decode circuit according to one or more embodiments.

Then, assume that "3" is inputted as a bit length of D. In response to the input, a character code of D is written in such a manner that the character code is inserted to an address immediately before the address in which the character code of C having a bit length of 5 (i.e. the address 2) in the decode Huffman table, as shown in FIG. 10D. Consequently, the character code of C having a bit length of 5 is shifted to an address 3. At this time, in the pointer table, the value for a bit length of 3 in the Num section is incremented to "3," and the value for each of a bit length of 4 and a bit length of 5 is incremented to "3."

Figure 10E:
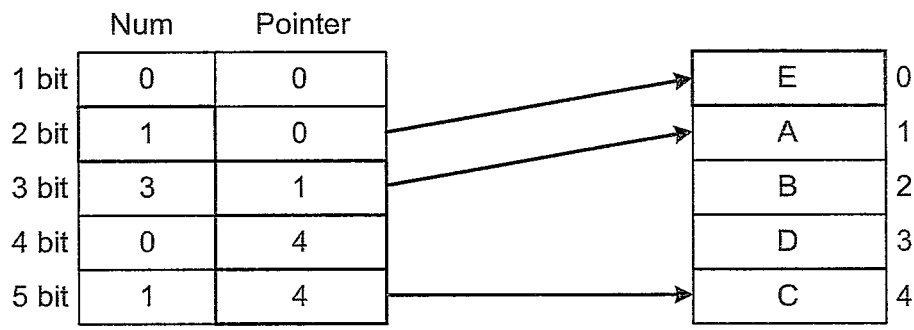

Then, assume that "2" is inputted as a bit length of E. Here, a character code of E needs to be stored in an address before the address in which the character code of a bit length of 3 is stored in the decode Huffman table. Accordingly, in response to the input, the character code of E is stored in the address 0 as shown in FIG. 10E. Consequently, the data pieces stored in the address 0 and the addresses subsequent thereto are sequentially shifted to be written in the address 1 and the addresses subsequent thereto, respectively. At this time, in the pointer table, the value for a bit length of 2 in the Num section is incremented to "1," and the value for of a bit length of each of 3 and above is incremented by 1.

Figure 10F:
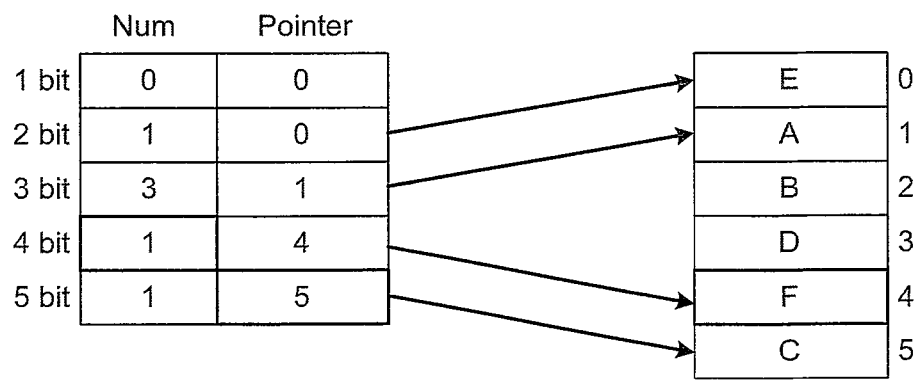

Then, assume that "4" is inputted as a bit length of F. In response to the input, a character code of F is written to an address 4 in such a manner that the character code is inserted between the character codes respectively for a bit length of 3 and a bit length of 4 in the decode Huffman table as shown in FIG. 10F. Consequently, the character code of a bit length of 5 or longer is sequentially shifted. At this time, in the pointer table, the value for a bit length of 4 in the Num section is incremented to "1," and the value for a bit length of 5 in the Pointer section is incremented by 1.

As described above, in the embodiment, the Huffman table subjected to real-time sorting can be created by using the shift memory circuit 31 with an insertion function. Using the table can eliminate the necessity of the sorting processing that used to be performed and takes at least 286 clocks. This enables speedup of the processing.

In the following, the decode data calculation circuit 30 that performs the above operation will be described in more detail.

Figure 11:
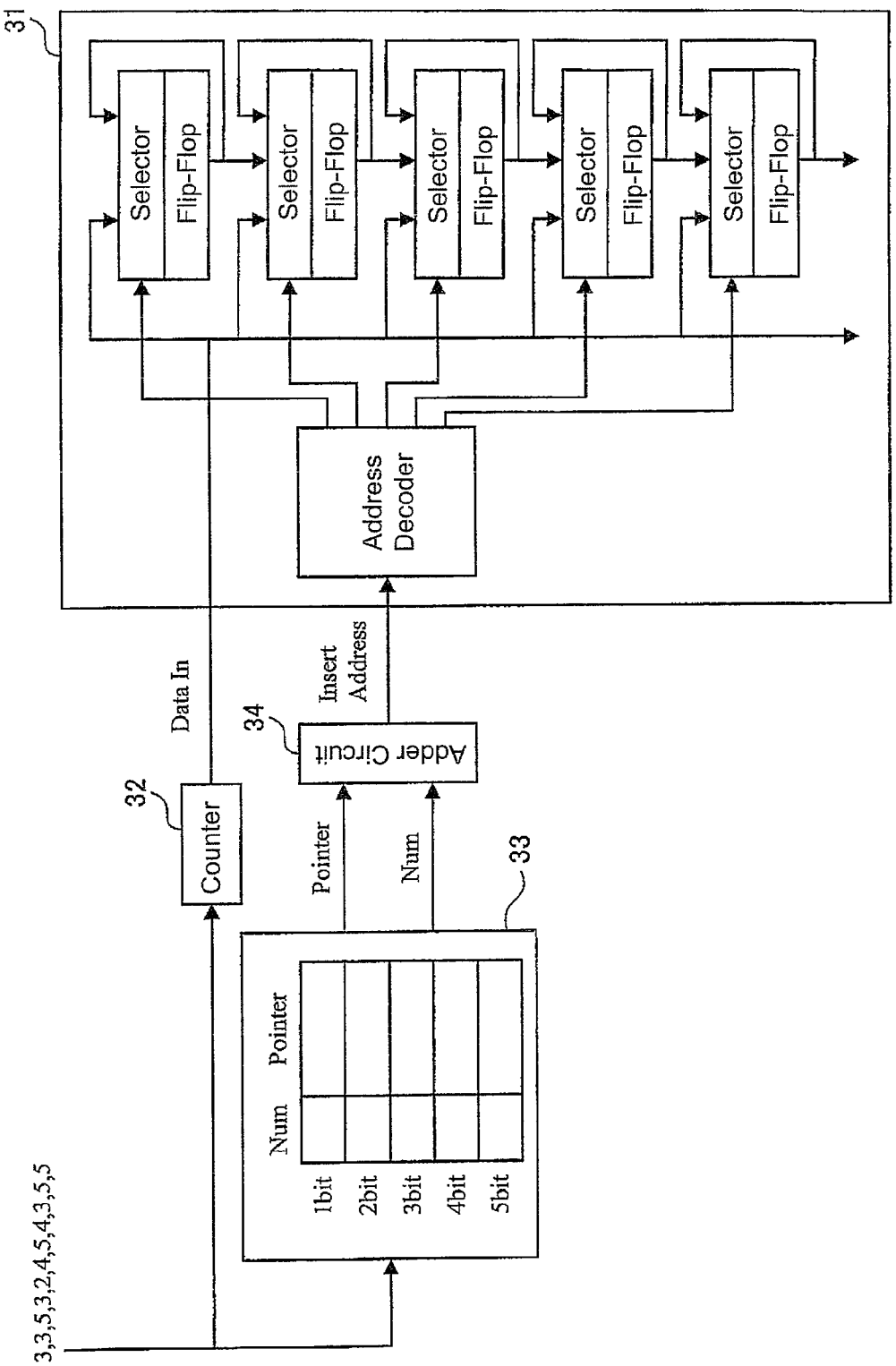
FIG. 11 is a diagram showing an example configuration of the decode data calculation circuit of the Huffman table decoding circuit according to one or more embodiments.

FIG. 11 is a view showing the decode data calculation circuit 30 of the embodiment.

As shown in FIG. 11, an array of inputted bit lengths is inputted to a counter 32. Upon receipt of the input, the counter 32 counts the bit lengths starting from 0, which is the minimum value of an ASCII code, every time a bit length is inputted. Then, the counter 32 supplies the shift memory circuit 31 with an insertion function, with the result of the counting (i.e. an ASCII code) as a Data In signal.

Meanwhile, the array of the inputted bit lengths is also inputted to a pointer table 33. When a Pointer signal and a Num signal are outputted from the pointer table 33, which will be described later in detail, an adder circuit 34 adds the values of the signals, and supplies the result of the addition as an Insert Address signal to the shift memory circuit 31 with an insertion function.

Upon receipt of the signal, the shift memory circuit 31 with an insertion function performs the operation described by reference to FIG. 8, and causes the flip-flops 42-1, 42-2, . . . to hold the character codes corresponding to the inputted bit lengths, respectively, the character codes being sorted in the bit length order.

Next, a circuit for a Pointer section of the pointer table 33 will be described.

Figure 12:
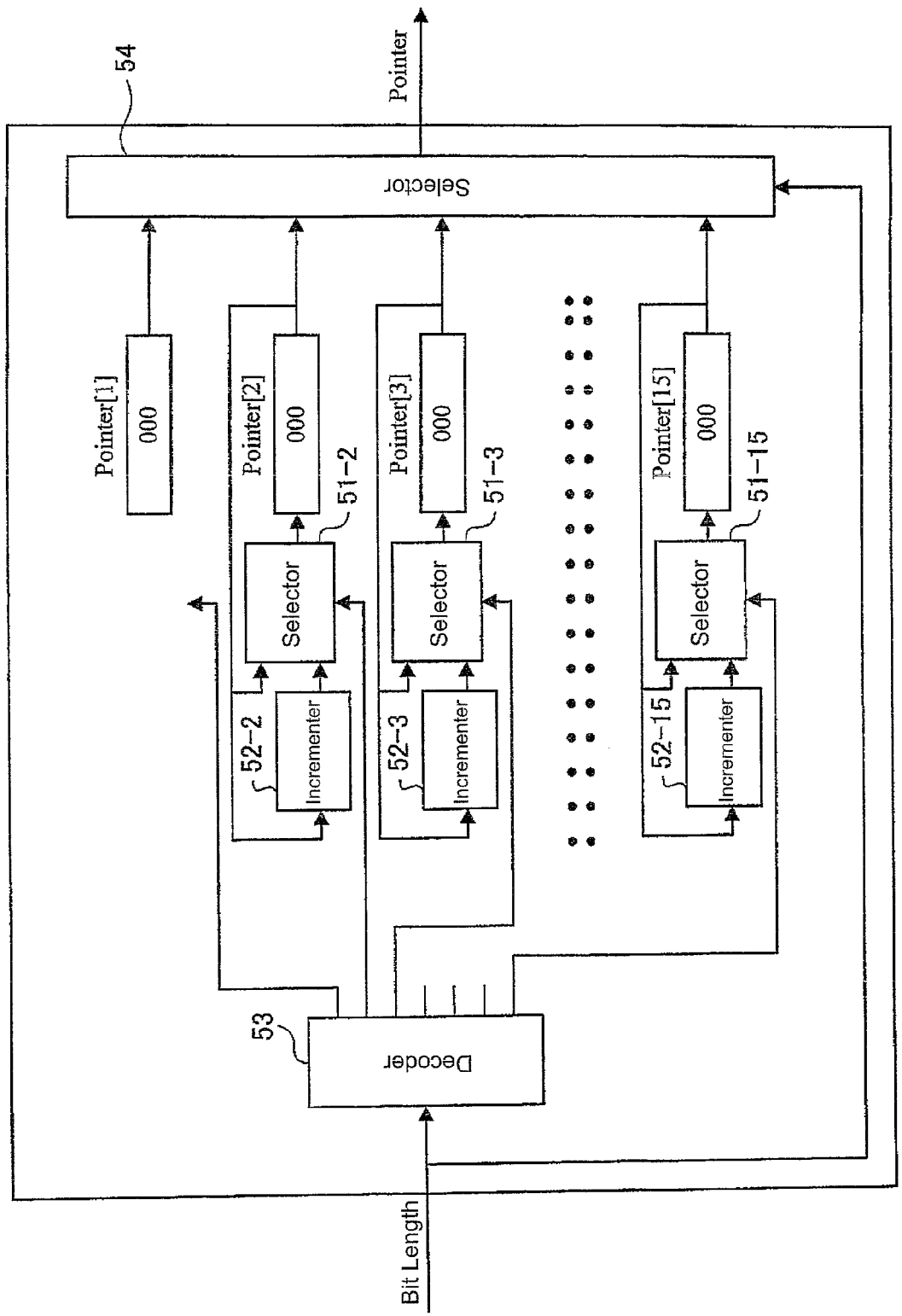
FIG. 12 is a diagram showing an example configuration of a Pointer section of the pointer table in the decode data calculation circuit of the Huffman table decoding circuit according to one or more embodiments.

FIG. 12 is a view showing an example of a circuit for a Pointer section of the embodiment. It should be noted that, although the circuit for the case where the maximum value of an inputted bit length is "15" is shown here, the maximum value of an inputted bit length is not limited thereto.

In the circuit, a selector 51-M selects a value from a value held by Pointer[M] and a value obtained by an incrementer 52-M by adding "1" to the value held by Pointer[M]. The decoder 53 instructs the selector 51-M which value to select. The decoder 53 outputs a 15-bit signal corresponding to the inputted bit length. Here, if the inputted bit length is K, the 15-bit signal has "0" from the first bit to the K-th bit, and has "0" in other bits. For example, if the inputted bit length is 1, the signal is "011111111111111," if the inputted bit length is 2, the signal is "001111111111111," and if the inputted bit length is 15, the signal is "000000000000000." Then, a signal of the K-th bit among the 15 bits is supplied to a selector 51-K. Since a signal of the first bit is always "0" regardless of the inputted bit length, only an output line from the decoder 53 is shown in FIG. 12. However, this it not necessarily provided. With this configuration, if the inputted bit length is K and M<K, Pointer[M] is not counted up. If M>K, on the other hand, Pointer[M] is counted up. Here, the initial value of Pointer[M] is "0" as shown in FIG. 12.

In addition, the inputted bit length is also outputted to a selector 54. Then, the selector 54 outputs, to the adder circuit 34 (see FIG. 11), Pointer[M] corresponding to the inputted bit length, as a Pointer signal.

Next, a circuit for a Num section of the pointer table 33 will be described.

Figure 13:
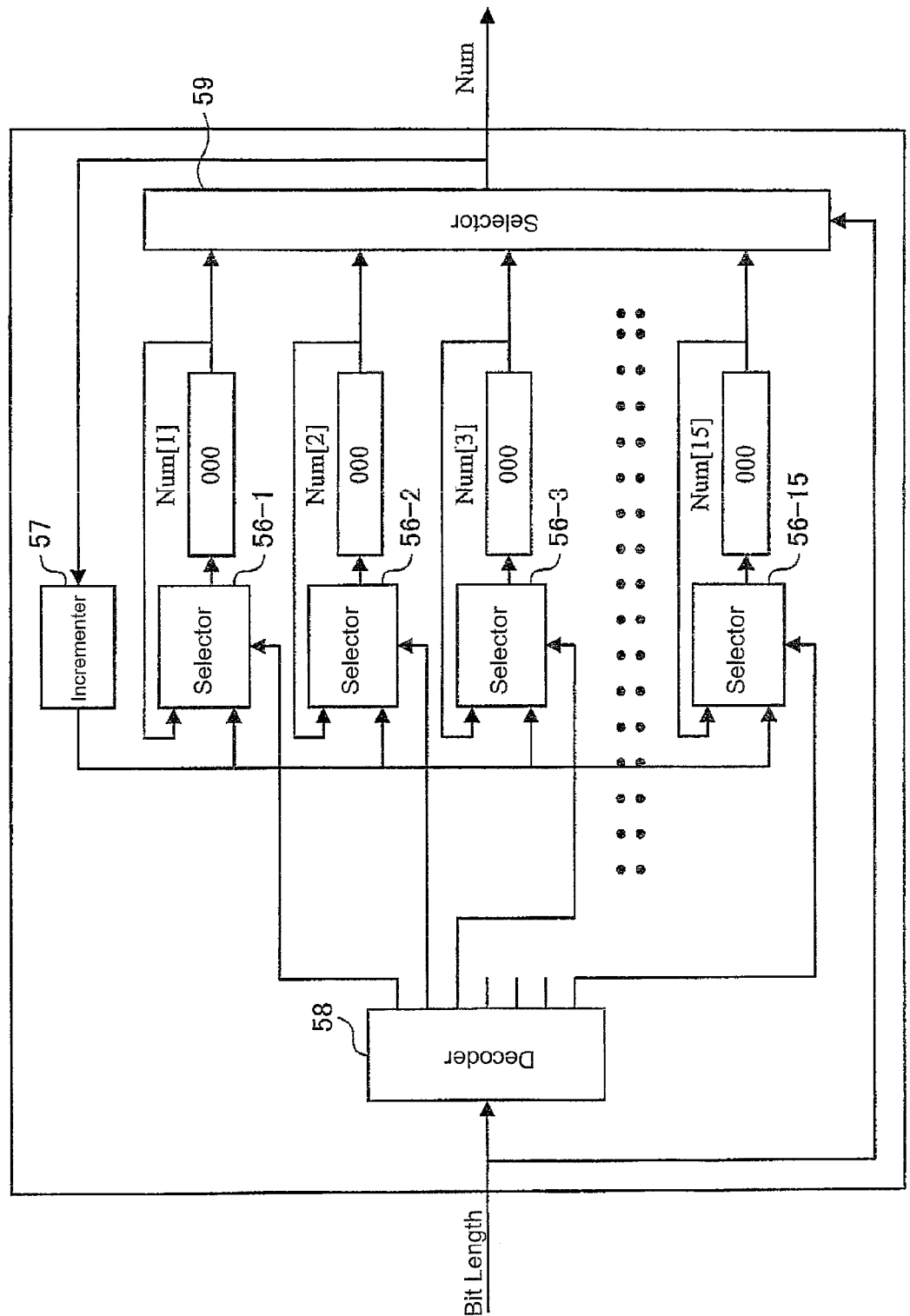
FIG. 13 is a diagram showing a configuration example of a Num section of the pointer table in the decode data calculation circuit of the Huffman table decoding circuit according to one or more embodiments.

FIG. 13 is a view showing an example of a circuit for a Num section of the embodiment. It should be noted that, although the circuit for the case where the maximum value of an inputted bit length is "15" is shown here as well, the maximum value of an inputted bit length is not limited thereto.

In the circuit, a selector 56-M selects a value from a value held by Num[M] and a value obtained by an incrementer 57 by adding "1" to a value outputted by a selector 59 (to be described later). A decoder 58 instructs the selector 56-M which value to select. The decoder 58 outputs a 15-bit signal corresponding to the inputted bit length. Here, if the inputted bit length is K, the 15-bit signal has "1" in the K-th bit, and has "0" in other bits. For example, if the inputted bit length is 1, the signal is "100000000000000," if the inputted bit length is 2, the signal is "010000000000000," and if the inputted bit length is 15, the signal is "000000000000001." Then, a signal of the K-th bit among the 15 bits is supplied to a selector 56-K. With this configuration, if the inputted bit length is K and M=K, Num[M] is counted up. If M≠K, on the other hand, Num[M] is not counted up. Here, the initial value of Num[M] is "0" as shown in FIG. 13.

In addition, the inputted bit length is also outputted to a selector 59. Then, the selector 59 outputs, to the adder circuit 34 (see FIG. 11), Num[M] corresponding to the inputted bit length, as a Num signal.

Here, the decode Huffman table is an example of symbol information or decode information, and the Pointer section of the pointer table 33 is an example of order information or decode information. Moreover, the decode data calculation circuit 30 is provided as an example of a second generation unit for generating symbol information and also order information.

In the decode data calculation circuit 30 of the embodiment, the Num section for registering the number of characters for each bit length is provided in the pointer table. However, this configuration is merely an example, and a configuration not including the Num section is also conceivable. For example, an Enable section for registering whether or not there is any character for each bit length may be provided instead. In this case, the number of characters for a bit length of M can be obtained on the basis of a difference between Pointer[M] and Pointer[M+1].

Moreover, the inputted compressed Huffman table data is processed by the frequency-of-use calculation circuit 10, the code calculation circuit 20 and the decode data calculation circuit 30 in this order to create the decode Huffman table data and the decode code table in the Huffman table decoding circuit 100 of the embodiment. However, the configuration is not limited thereto. For example, as long as the decode data calculation circuit 30 has a configuration for calculating the number of characters for each bit length on the basis of the inputted compressed Huffman table data (Num section), the frequency-of-use calculation circuit 10 is not necessarily provided. In this case, however, the processing by the code calculation circuit 20 using the number of characters for each bit length is performed after the processing by the decode data calculation circuit 30. Specifically, the code calculation circuit 20 calculates code_min[M] and code_max[M] by using Num[M] instead of b1_count[M].

Lastly, the flow of the operation by the Huffman decoding apparatus of the embodiment will be described.

Figure 14:
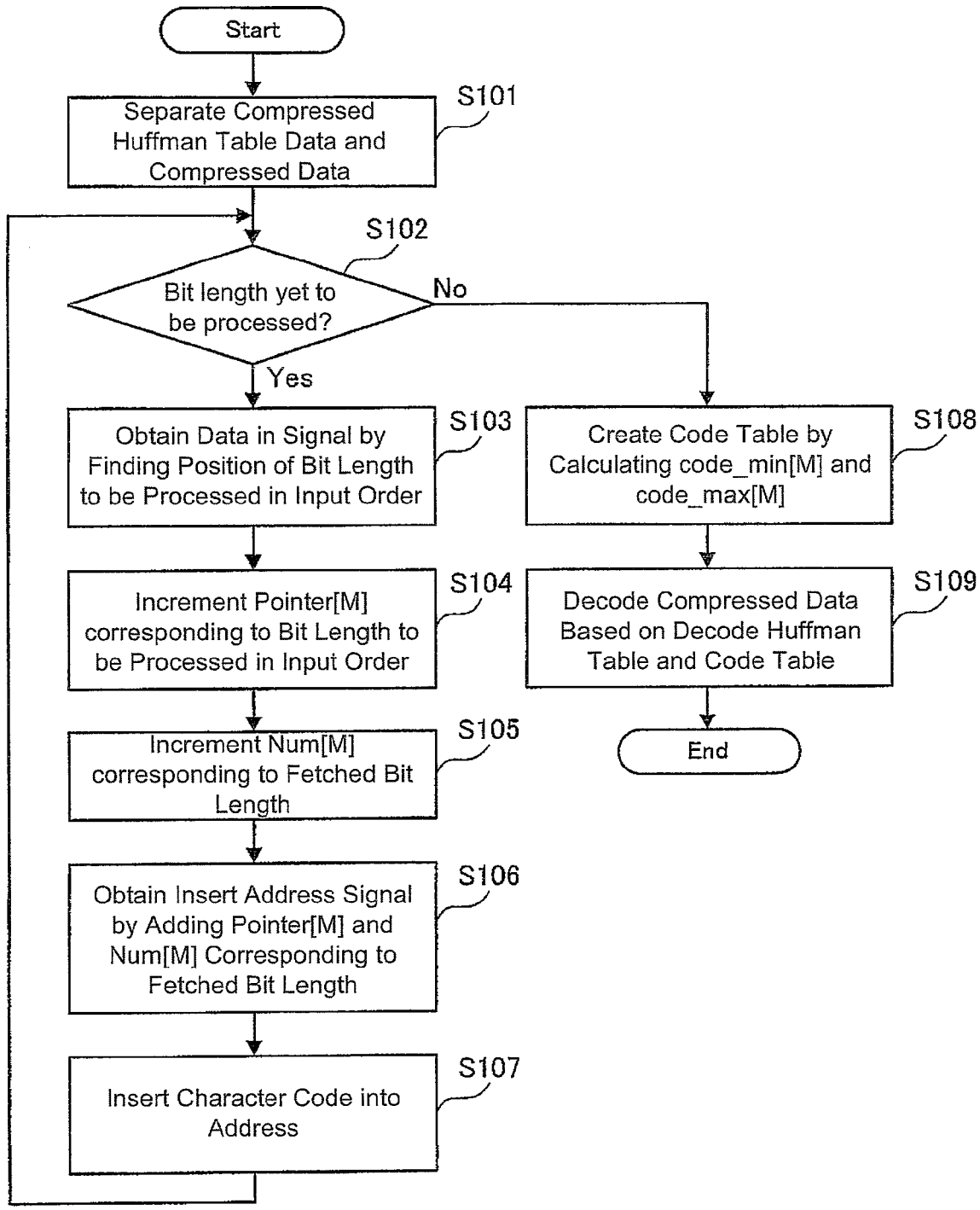
FIG. 14 is a flowchart depicting an example flow of the Huffman decoding apparatus according one or more embodiments.

FIG. 14 is a flowchart showing the flow of the operation of this case. It should be noted that the flow of the operation is based on the assumption that the processing by the code calculation circuit 20 is performed after the processing by the decode data calculation circuit 30 as described above.

As shown in FIG. 14, in the Huffman decoding apparatus of the embodiment, upon receipt of data including compressed Huffman table data and compressed data, the Huffman table separation circuit 200 separates the data (Step 101).

Then, in the Huffman table decoding circuit 100, the decode data calculation circuit 30 judges whether there is a bit length yet to be processed in the compressed Huffman table data (Step 102).

If it is judged as a result that there is a bit length yet to be processed, the decode data calculation circuit 30 fetches the bit length that is not processed, and the counter 32 converts an input order for the bit length to a character code, to thereby obtain a Data In signal (Step 103).

Subsequently, in the pointer table 33, the decode data calculation circuit 30 adds "1" to Pointer[M] corresponding to a bit length that is longer than the fetched bit length (Step 104), and adds "1" to Num[M] corresponding to the fetched bit length (Step 105). Thereafter, the adder circuit 34 adds Pointer[M] and Num[M] corresponding to the fetched bit length, to thereby obtain an Insert Address signal (Step 106).

Thereafter, the decode data calculation circuit 30 inserts the character code designated by the Data In signal, into an address designated by the Insert Address signal of the shift memory circuit 31 with an insertion function (Step 107).

If it is judged that there is no bit length that is not processed, on the other hand, a decode Huffman table is already created through the processing in Step 103 to Step 107. Accordingly, the code calculation circuit 20 calculates code_min[M] and code_max[M] for each bit length on the basis of Num[M], and thereby creates a code table as a decode code table (Step 108).

Thereafter, the Huffman decoding circuit 300 replaces each code included in the compressed data with a character to which the code is assigned, by using the decode Huffman table data and the code table data, and thereby generates non-compressed data (Step 109).

In the embodiment, the phrase "in a bit length order" is used to mean the ascending order of bit lengths. However, the phrase may be used to mean the descending order of bit lengths or any other order related to bit lengths. In other words, the phrase "in a bit length order" can be understood as a "predetermined order related to bit lengths" more generally.

Moreover, in the embodiment, the input order of the bit lengths is in the ASCII code order of the characters corresponding to the bit lengths. However, the input order may be understood as a "predetermined order related to symbols" more generally, as well.

Furthermore, in the embodiment, the description is given based on the assumption that multiple codes are used for each bit length. Accordingly, the pointers are provided in the pointer table to each indicate the address of the start of each bit length in the decode Huffman table. However, the configuration is not limited thereto. For example, in a case based on the assumption that only one code is used for each bit length, the storing order of each symbol in the decode Huffman table indicates the bit length of the symbol. Accordingly, in this case, a configuration of not including any pointer in the pointer table is also conceivable.

As described above, in the embodiment, among the two steps, i.e. (1) extracting a bit length and (2) decoding a code based on the extracted bit length, the sorting processing on the Huffman table in the step (2) is performed in real time. Specifically, the sorting processing is performed in parallel with inputting the compressed Huffman table data by using the shift memory circuit with an insertion function. With this configuration, a Huffman table already being sorted is completed when the last data piece in a compressed Huffman table is inputted. Hence, the processing is sped up compared to a method of performing the sorting processing after the compressed Huffman table is inputted.

The present invention has been described above based on the embodiment. However, the technical scope of the present invention is not limited to the above-described embodiment. It is apparent to those skilled in the art that making various changes and employing alternative embodiments are possible without departing from the spirit and the scope of the present invention.

What is claimed is:

1. A method for decoding encoded data, comprising:
receiving encoded data that is encoded by replacing each of a plurality of characters with one of a plurality of bit strings corresponding to the character;
recording, on the basis of definition information defining a plurality of bit lengths of the bit strings each corresponding to one of the plurality of characters, at least one of the plurality of characters as corresponding to each of the plurality of bit lengths;
generating decode information based on the number of characters recorded, wherein the decode information comprises bit string information for sorting the plurality of bit strings in a bit length order that is a predetermined order associated with bit lengths; and
in response to receiving a particular bit length among the plurality of bit lengths, generating character information in which the plurality of characters are sorted in the bit length order by inserting a character corresponding to the particular bit length into a position corresponding to the particular bit length in an array in which at least one of the plurality of bit lengths, wherein the particular bit length and a previously received bit length are sorted in the bit length order.

2. The method of claim 1,
wherein the bit string information comprises a plurality of reference bit strings serving as references for bit strings having the respective bit lengths, and
the method further comprising, in response to the input of the particular bit length, generating order information indicating an order of the symbols corresponding to the plurality of reference bit strings in the symbol information, by rearranging the order of the at least one of the plurality of bit lengths inputted prior to the particular bit length such that a position of a reference bit string having a bit length after the particular bit length in the bit length order is shifted back while a position of a reference bit string having a bit length prior to the particular bit length in the bit length order or the same bit length as the particular bit length is kept unchanged.

3. The method of claim 1,
wherein the plurality of bit lengths are received in a predetermined input order associated with the plurality of characters, and
the method further comprising determining a particular character corresponding to the particular bit length in accordance with a position of the particular bit length in the predetermined input order.

4. The method of claim 1, further comprising:
in response to receiving the particular bit length, increasing the number of characters corresponding to the same bit length as the particular bit length without changing the number of characters corresponding to each bit length different from the particular bit length.

* * * * *